United States Patent
Mobin et al.

(10) Patent No.: US 7,193,461 B2
(45) Date of Patent: Mar. 20, 2007

(54) METHOD AND APPARATUS FOR PERFORMING DIGITAL PRE-DISTORTION

(75) Inventors: Mohammad Shafiul Mobin, Orefield, PA (US); Jeffrey H. Saunders, Andover, MA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 73 days.

(21) Appl. No.: 10/919,029

(22) Filed: Aug. 16, 2004

(65) Prior Publication Data

US 2006/0033569 A1    Feb. 16, 2006

(51) Int. Cl.
*H03F 1/26* (2006.01)
(52) U.S. Cl. .......................................... 330/149; 330/2
(58) Field of Classification Search ............... 330/149
See application file for complete search history.

(56) References Cited

U.S. PATENT DOCUMENTS

| | | | | |
|---|---|---|---|---|
| 5,900,778 A | * | 5/1999 | Stonick et al. | 330/149 |
| 6,853,246 B2 | * | 2/2005 | Bauder et al. | 330/149 |
| 2006/0022751 A1 | * | 2/2006 | Fuller et al. | 330/136 |

* cited by examiner

*Primary Examiner*—Khanh Van Nguyen

(57) ABSTRACT

A pre-distorter that compensates for amplitude and phase distortion created by an amplifier. During a training session, the amplifier is stimulated with input signals of pre-selected amplitude and phase at various temperatures and the amplifier output is captured and converted into data sets. Polynomials are then fitted to the data sets and inverses of the polynomials are determined. The coefficients of the inverse polynomials are then saved for each temperature. During operation, the amplifier temperature is predicted based on the amplifier input signal and the coefficients associated with the predicted temperature are selected to be applied to the input signal to compensate for amplitude and phase distortion caused by the amplifier.

7 Claims, 5 Drawing Sheets

METHOD AND APPARATUS FOR PERFORMING DIGITAL PRE-DISTORTION

TECHNICAL FIELD OF THE INVENTION

The present invention generally relates to compensating for non-linearities in amplifiers and, more particularly, to a method and an apparatus for performing digital pre-distortion in an amplifier to compensate for the non-linearities in the amplifier.

BACKGROUND OF THE INVENTION

A typical power amplifier does not behave linearly. There are occasions when the power amplifier gives compression to the output of the amplifier and there are occasions when it gives expansion to the output. Typical signal detectors that receive and decode these amplified signals cannot operate in such a non-linear fashion. Therefore, it is necessary to linearize the amplifier output by applying inverse distortion at the input to the power amplifier to undo the compression or expansion produced by the amplifier. Digital pre-distorters are commonly used with power amplifiers to invert the power amplifier saturation characteristics by expanding the saturation regions and compressing the expansion regions in the power amplifier characteristics curve.

FIG. 1 is a block diagram of a typical digital pre-distorter 1 and power amplifier 2. The input signal received by the pre-distorter 1, $V_{IN}$, is pre-distorted by the pre-distorter 1 into a pre-distorted signal, $V_{PD}$. The pre-distorted signal $V_{PD}$ is such that the non-linearities of the power amplifier 2 cause the power amplifier 2 to produce an output signal, $V_{OUT\_TARGET}$, that is closer to what an ideal output signal of the power amplifier 2 should be.

The basic principles of a typical digital pre-distorter can be seen from the graph shown in FIG. 2. In FIG. 2, the vertical axis represents the voltage output of a typical power amplifier and the horizontal axis represents the voltage input to the power amplifier. The linear operation of the power amplifier is represented by the following equation:

$$y = mx + c,$$

where m is the linear gain of the power amplifier and c=0 is the output intercept point. This equation corresponds to line 3 in FIG. 2, which has a slope equal to m. The curve 4 in the graph of FIG. 2 corresponds to a non-pre-distorted output characteristic curve for a typical power amplifier. The non-linearities of the power amplifier result in amplitude-to-amplitude (AM/AM) distortion as well as amplitude-to-phase (AM/PM) distortion, which results in curve 4 being non-linear.

A digital pre-distorter actually increases or decreases the amplifier input magnitude to linearize the amplifier output, i.e., to make curve 4 look more like line 3. The digital pre-distorter asserts a negative phase distortion to mitigate the phase distortion introduced by the power amplifier. It can be seen from FIG. 2 that in order to increase the amplifier output magnitude by $\Delta V_{OUT}$ so that Vout_target=Vout_nopd+$\Delta$Vout, the amplifier input magnitude needs to be increased by $\Delta V_{IN}$ so that Vpd=Vin+$\Delta$Vin. The pre-distorter performs these functions by first fitting an odd ordered polynomial to the power amplifier magnitude characteristic curve (e.g., curve 4 in FIG. 2), calculating the inverse of the polynomial, and then applying the coefficients of the inverse polynomial to the amplifier input in the pre-distorter to linearize the amplifier output. In essence, applying the coefficients to the amplifier input creates inverse distortion that reverses any compression or expansion caused by the amplifier.

Furthermore, the amplifier output characteristics change over short and long periods of time giving rise to what are commonly referred to as slow memory effect and fast memory effect. Therefore, the appropriate polynomial must be selected for the appropriate circumstances. Then, its inverse polynomial obtained, and then the coefficients of the inverse polynomial applied to the amplifier input to cause the amplifier output characteristic curve to be altered. In addition, the selection of the appropriate polynomial and the application of the coefficients of its inverse to the amplifier output characteristic curve should be done very quickly, or as close to real-time as possible.

Slow memory effect is defined as changes to the amplifier output characteristics due to aging, slow changes in ambient temperature, humidity, etc. Fast memory effect is defined as changes to the amplifier output characteristics due to instantaneous changes in the operating temperature of the amplifier. Because of these changes, it is generally not sufficient to use the same inverse polynomial coefficients all of the time. FIG. 3A is a graphs illustrating the amplifier output characteristic curves for various temperatures for amplitude. The line 11 in FIG. 3 represents the target gain, which corresponds to the ideal amplifier output characteristic for amplitude. Curves 12–16 in FIG. 3 are the amplifier amplitude output characteristic curves for operating temperatures T1–T5, respectively, where T5<T4<T3<T2<T1. The amplifier curves 12–15 as a function of temperature are commonly referred to as memory characteristic curves.

It is known to use adaptive negative feedback systems that measure the amplifier output and determine which polynomial coefficients to select based on the output of the amplifier. In such systems, based on the measured amplifier output, it is determined which amplifier memory characteristic curve corresponds to the current temperature, and the corresponding coefficients are applied to correct for gain and phase (delta coefficients for gain and distortion coefficients for phase). One disadvantage of these systems is that they typically use large arrays of read-only memory (ROM) or complex lookup tables to store the coefficients and complex computer processing, which increases power consumption and adds delay in the feedback loop. Also, such systems often use expensive temperature sensors to sense the amplifier temperature to determine which coefficients to select. Sensing amplifier temperature not only increases system costs, but also makes the system prone to error. Furthermore, such systems are incapable of performing fast memory compensation using coefficients that correspond to an appropriate memory characteristic curve. Rather, a composite curve is typically used, which blends all temperatures into a resultant curve. Using the resultant curve rather than individual memory curves also makes the system more error prone.

Accordingly, a need exists for an amplifier digital pre-distorter that does not require large memory arrays for storing the delta and distortion coefficients, that does not require temperature sensors, and that is capable of performing fast memory compensation without the need to use a resultant memory characteristic curve.

SUMMARY OF THE INVENTION

The present invention provides a pre-distorter apparatus, method and computer program for compensating for non-linearities in an amplifier. The pre-distorter comprises predictor circuitry and processing circuitry. The predictor circuitry predicts the temperature of the amplifier based on an input signal and generates a predictor output signal that is based on the temperature prediction. The processing circuitry selects inverse polynomial coefficients based on the predictor output signal and applies the coefficients to the input signal to compensate for non-linearities in the amplifier.

The method of pre-distorting an amplifier input signal to compensate for non-linearities of the amplifier comprises predicting a temperature of the amplifier based on the input signal and applying inverse polynomial coefficients to the input signal that are selected based on the prediction. The coefficients applied are those that are associated with an output characteristic curve of the amplifier for the predicted temperature.

The computer program of the present invention corresponds to a training algorithm for calculating inverse polynomial coefficients that are to be applied to an amplifier input signal to pre-distort the amplifier input signal to compensate for non-linearities of the amplifier. A first routine of the program captures a plurality of amplifier output signals produced by the amplifier in response to the amplifier being stimulated by a plurality of respective amplifier input signals. The output signals correspond to respective amplifier temperatures. A second routine fits respective polynomials to respective data sets that represent respective amplifier output signals. A third routine determines respective inverses of the respective polynomials. A fourth routine obtains respective sets of inverse polynomial coefficients from the respective inverses of the polynomials. The respective sets of coefficients correspond to respective temperatures of the amplifier.

These and other features and advantages of the present invention will become apparent from the following description, drawings and claims.

DETAILED DESCRIPTION OF THE PREFERRED EMBODIMENTS

Figure 1:
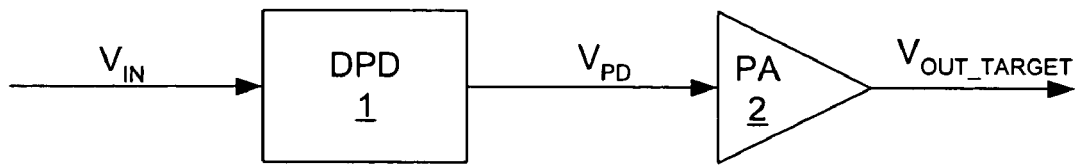
FIG. 1 is a block diagram of a typical digital pre-distorter and power amplifier.
Figure 2:
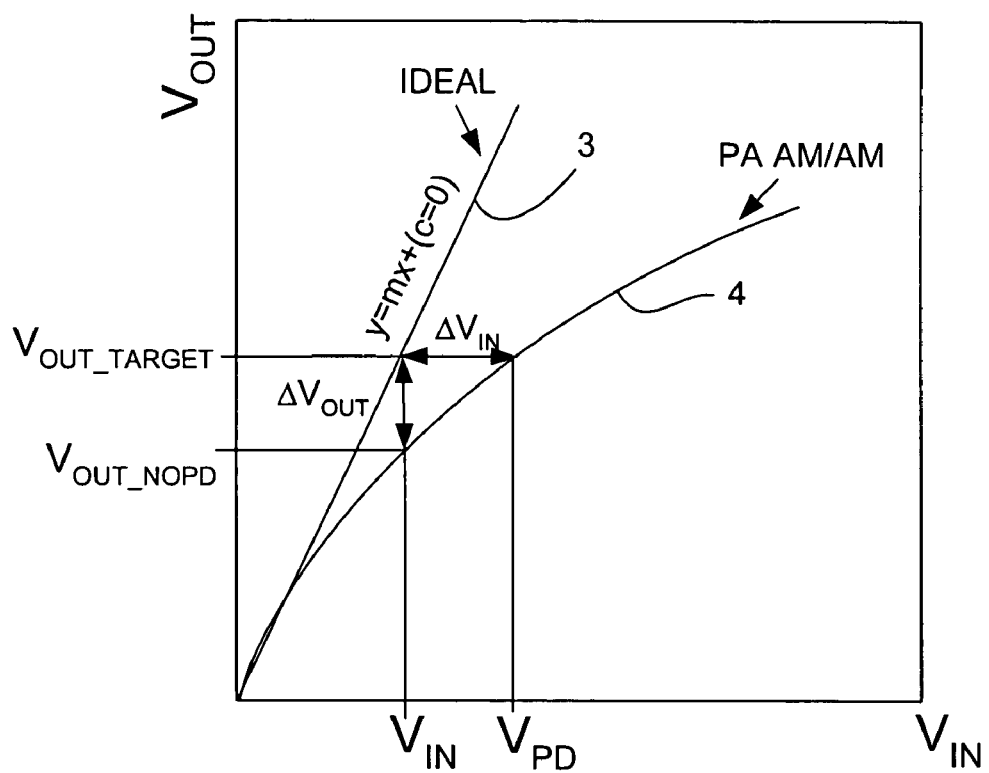
FIG. 2 is a graph demonstrating the basic principles of a typical digital pre-distorter.
Figure 3:
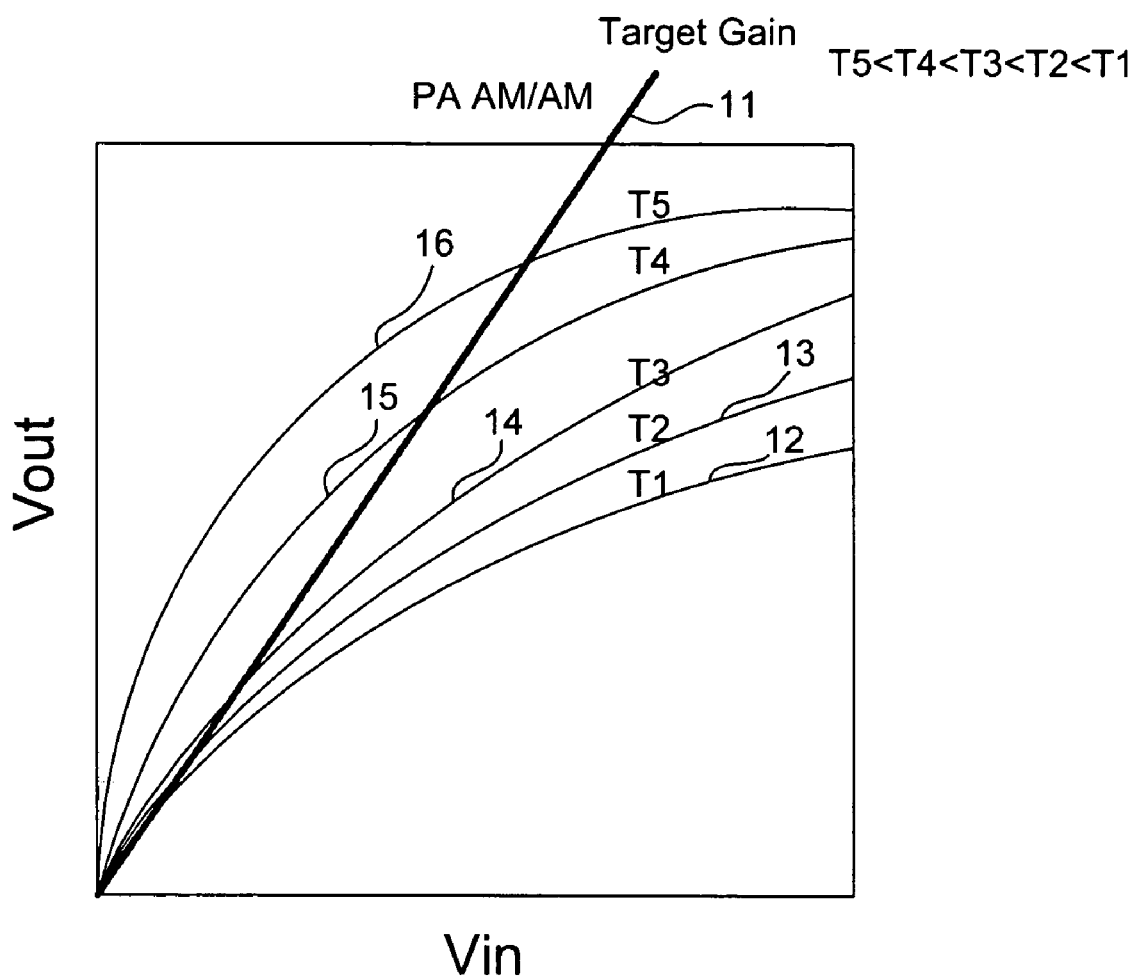
FIG. 3 is a graph illustrating the amplifier output amplitude characteristic curve for various temperatures.

In accordance with the present invention, it has been determined that it is possible to predict which of the memory characteristic curves 12–16 shown in FIG. 3 will correspond to the amplifier output characteristic curve based on the energy of the amplifier input. Once the correct memory characteristic curve has been selected, the corresponding coefficients are applied to the amplifier input signal. Because the selection is based on the amplifier input rather than the amplifier output or some other measurement obtained by probing the amplifier, it is possible to select and apply the corresponding coefficients to compensate fast memory effects of amplitude and phase distortion.

During a training session, the amplifier is stimulated with input signals of pre-selected amplitude and phase at various temperatures and the amplifier output is captured and converted into data sets. Polynomials are then fitted to the data sets and inverses of the polynomials are determined. The coefficients of the inverse polynomials are then saved for each temperature. During operation, the amplifier temperature is predicted based on the amplifier input signal and the coefficients associated with the predicted temperature are selected to be applied to the input signal to compensate for amplitude and phase distortion caused by the amplifier. The manner in which these tasks are performed will now be described with reference to FIGS. 4–7.

Figure 4:
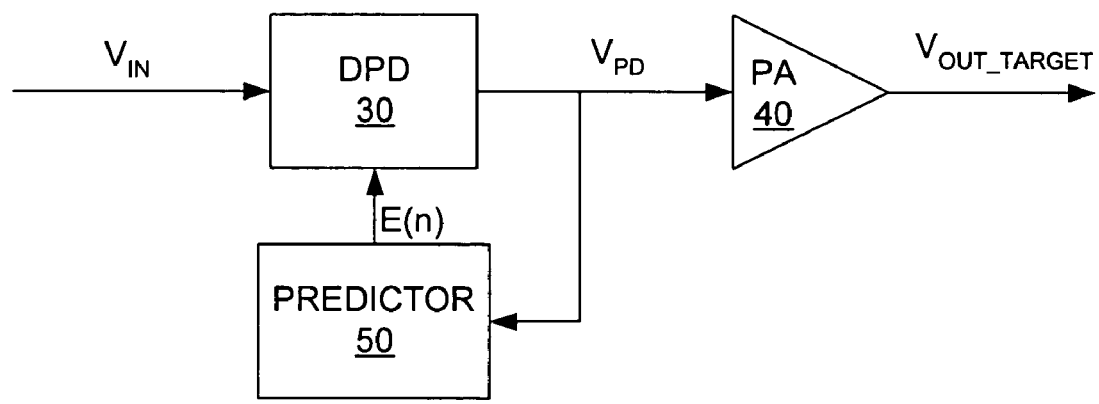
FIG. 4 is a block diagram of the pre-distorter of the present invention and predictor circuitry in accordance with an embodiment.

FIG. 4 is a block diagram of the present invention in accordance with an embodiment. In accordance with the embodiment represented by FIG. 4, predictor circuitry 50 receives the output of the digital pre-distorter 30, $V_{PD}$, and generates a predictor that is used by the pre-distorter 50 to select the appropriate memory characteristic curve based on the energy of $V_{PD}$.

Figure 5:
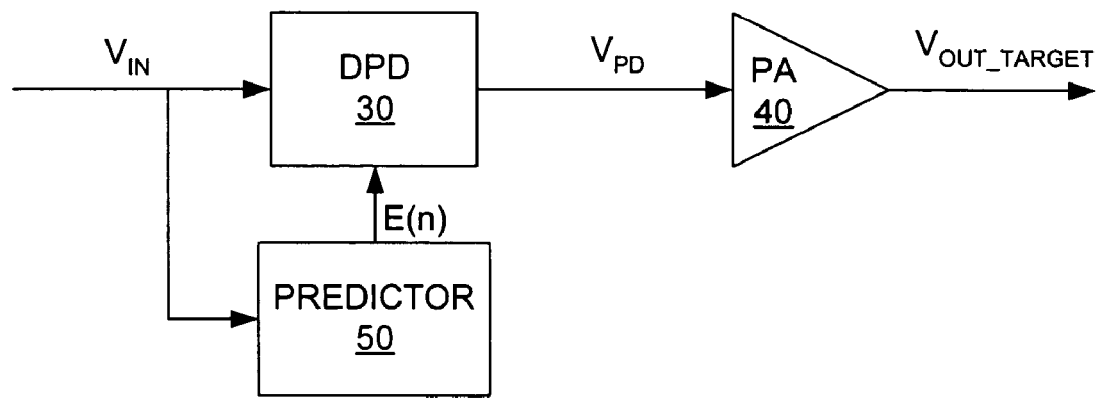
FIG. 5 is a block diagram of the pre-distorter of the present invention and predictor circuitry in accordance with another embodiment.

Alternatively, as shown in FIG. 5, the predictor circuitry 50 receives $V_{IN}$ prior to the pre-distorter 30 and makes the prediction based on the energy of $V_{IN}$. In accordance with the preferred embodiment, the predictor circuitry 50 is a filter that filters the amplifier input, either prior to or after the pre-distorter 30, and dynamically predicts the operating temperature of the amplifier 40. A variety of different filters can be used as predictor circuitry for this purpose, such as, for example, a moving average (MA) filter, an infinite impulse response (IIR) filter, a lowpass (LP) filter, a finite impulse response (FIR) filter, etc. Those skilled in the art will understand, in view of the disclosure provided herein, the manner in which these various types of filters can be used to predict the amount of energy dissipated in the amplifier 40.

Figure 6:
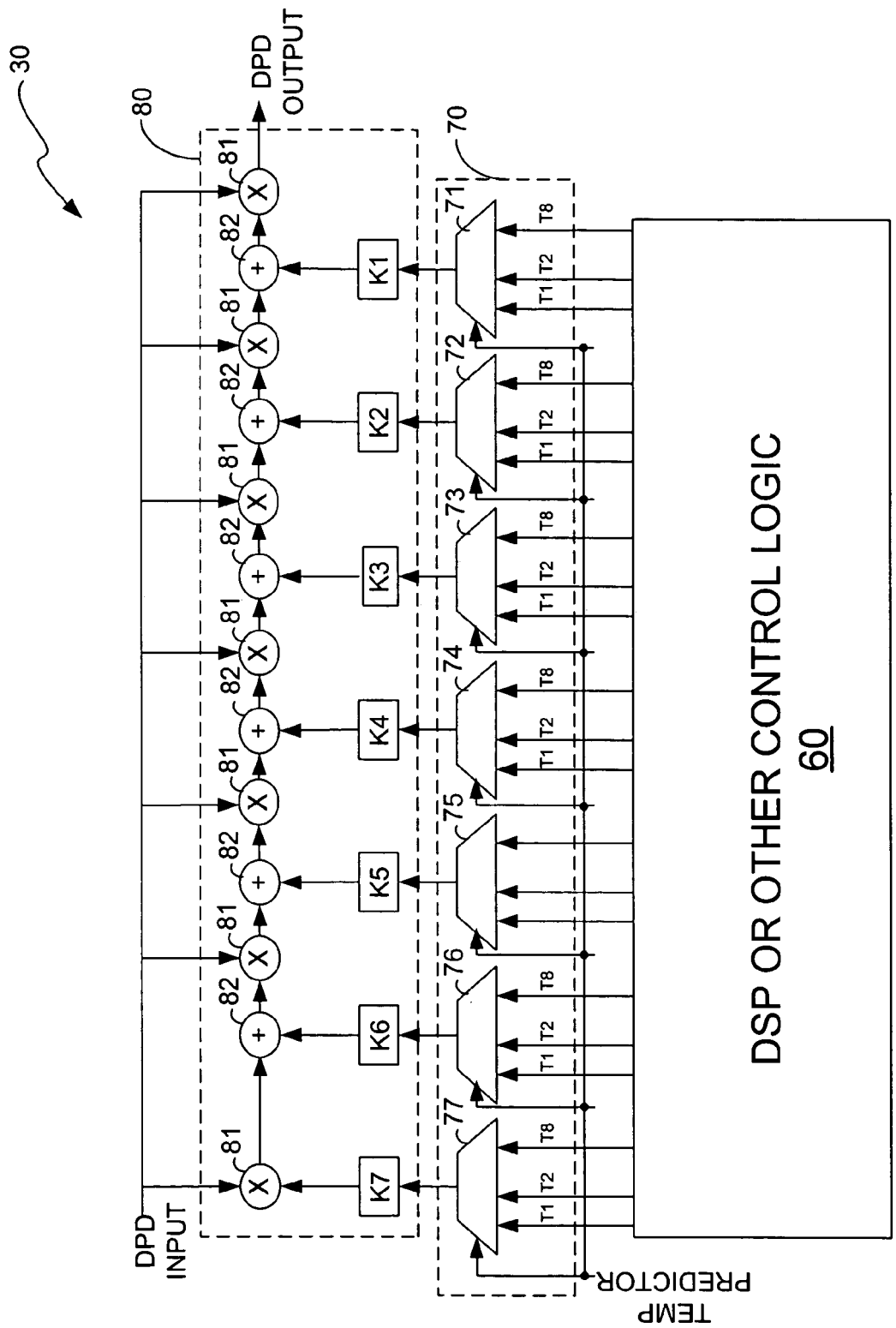
FIG. 6 is a block diagram of the digital signal processor (DSP), selection circuitry and coefficient injection circuitry of the pre-distorter of the present invention in accordance with an embodiment.

FIG. 6 is a block diagram of the digital pre-distorter 30 of the present invention in accordance with the preferred embodiment. The pre-distorter 30 preferably comprises a digital signal processor (DSP) 60, selection circuitry 70 and polynomial calculation circuitry 80. The DSP 60 may be any type of processor capable of performing the calculations described herein. The DSP 60 selects the appropriate memory characteristic output curve coefficients based on the predictor generated by the predictor circuitry 50. The polynomial calculation circuitry 80 applies the selected coefficients to the pre-distorter input signal to produce the pre-distorted output signal.

In order to obtain the output characteristic curves for different temperatures, T1 through TN, where N corresponds to the number of temperatures for which curves are obtained, a training procedure is performed during which input signals of varying amplitude and phase are input to the amplifier at different temperatures and measurements are taken to determine what the temperature output characteristic curve is for each given amplifier input. Then, during operation, the DSP 60 uses the predictor output by the predictor circuitry 50 to select the coefficients to be injected into the input signal. These selections are made in real-time on the fly by the DSP 60 such that even fast memory effects are compensated instantaneously.

This memory compensation architecture represented by FIG. 6 is capable of infinite precision by interpolating the polynomial coefficients of the N characteristics curves (e.g., T1–T8) obtained through the training procedure. An efficient recursive computation form of the pre-distorter polynomial is obtained by the DSP 60 during the training session as follows:

$$AM/AM, AM/PM = k1*y + k2*y^2 + k3*y^3 + k4*y^4 + k5*y^5 + k6*y^6 + k7*y^7$$

$$= y(k1 + k2*y^1 + k3*y^2 + k4*y^3 + k5*y^4 + k6*y^5 + k7*y^6)$$

$$= y(k1 + y(k2 + k3*y^1 + k4*y^2 + k5*y^3 + k6*y^4 + k7*y^5))$$

$$= y(k1 + y(k2 + y(k3 + k4*y^1 + k5*y^2 + k6*y^3 + k7*y^4)))$$

$$= y(k1 + y(k2 + y(k3 + y(k4 + k5*y^1 + k6*y^2 + k7*y^3))))$$

$$= y(k1 + y(k2 + y(k3 + y(k4 + y(k5 + k6*y^1 + k7*y^2)))))$$

$$= y(k1 + y(k2 + y(k3 + y(k4 + y(k5 + y(k6 + k7*y^1))))))$$

This realization allows the DSP or control logic 60 to perform fewer multiplications than would otherwise have to be performed (e.g., where N=8, 7 multiplications instead of 35).

As can be seen in FIG. 6, the DSP 60 outputs eight K1 coefficients corresponding to temperature characteristic curves for temperatures T1–T8 and multiplexer (MUX) 71 selects the correct K1 coefficient based on the current temperature predictor output from the predictor circuitry 50. Likewise, the DSP 60 outputs eight K2 coefficients corresponding to the memory characteristic curves for temperatures T1–T8 and MUX 72 selects the correct K2 coefficient based on the current temperature predictor output from the predictor circuitry 50. The same procedures are performed with respect to MUXes 73–77 for coefficients K3–K7, respectively.

Once the coefficients have been selected by the MUXes 71–77, they are provided to the polynomial calculation circuitry 80, which applies the coefficients to the input of the pre-distorter 30. The polynomial calculation circuitry 80 has multiplication and addition operators 81 and 82, respectively, that apply the coefficients to the input signal in accordance with the last line of the above interpolation, specifically:

Y(k1+y(k2+y(k3+y(k4+y(k5+y(k6+k7*y)))))), where Y corresponds to the input signal being operated upon by the polynomial calculation circuitry 80 and k1–k7 correspond to the coefficients.

The present invention provides many benefits. One benefit is that the need to use expensive ROM lookup tables to store coefficients for many characteristic curves is avoided, which reduces the cost, complexity and size of the pre-distorter 30. Another advantage of the present invention is that using the temperature predictor of the invention eliminates the need to use feedback temperature sensors, which typically require an analog-to-digital converter, a frequency down converter and physical access to the power amplifier transistor. Yet another advantage of the present invention is that the fast memory tracking it provides enables infinite precision temperature tracking to be performed using a single MUX selector signal. Yet another advantage of the present invention is that infinite precision temperature tracking can be achieved through the interpolation technique of the present invention.

Figure 7:
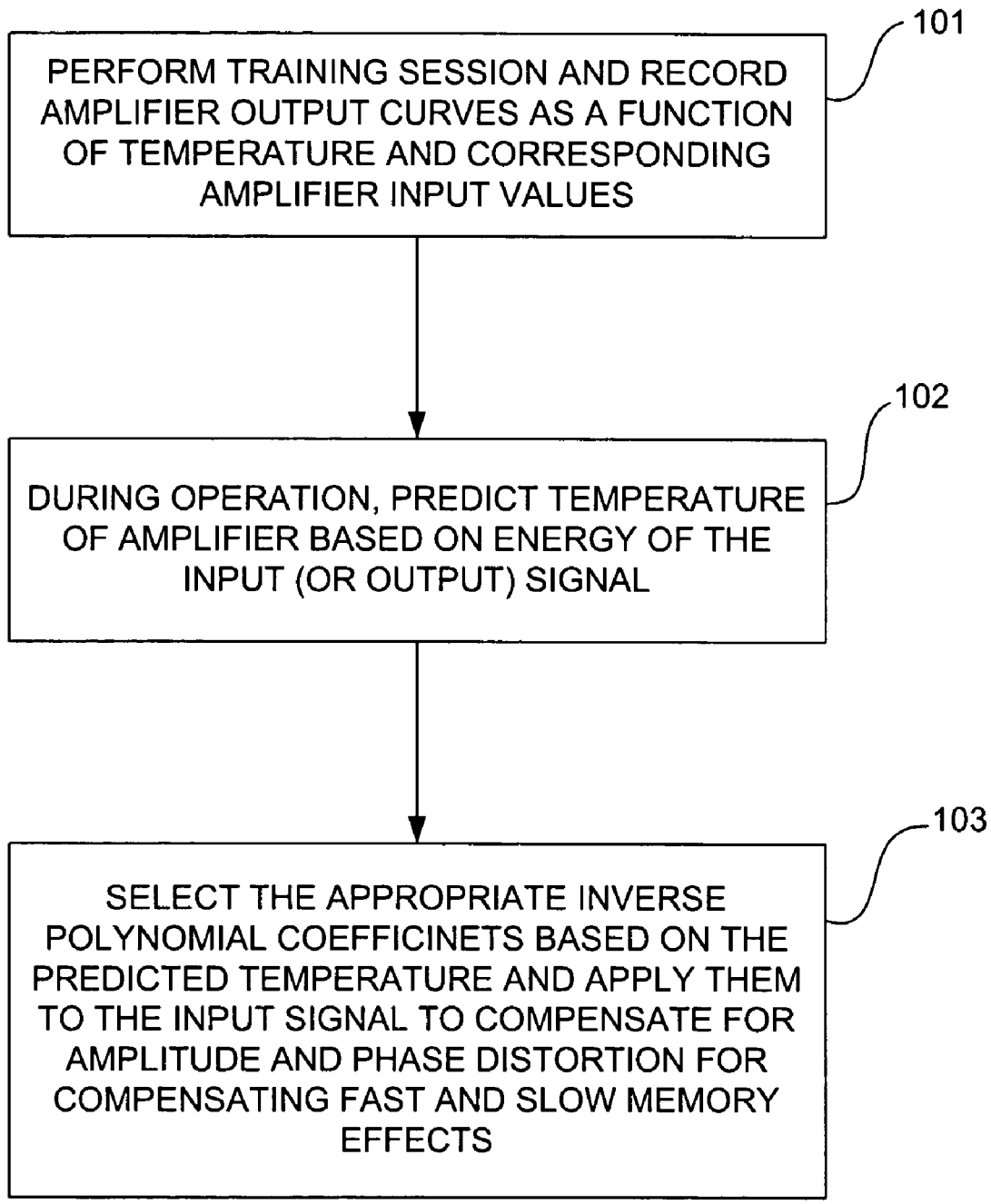
FIG. 7 is a flow chart of the pre-distortion method of the invention in accordance with an embodiment.

FIG. 7 illustrates a flow chart of the method of the present invention for performing pre-distortion in accordance with the preferred embodiment. The first step in the method involves the training session, which is represented by block 101. As stated above, during the training session, different input signals having pre-selected amplitude and phase sweep are input to the amplifier. The amplifier output signals are captured and polynomials are fitted to the captured data. This process is repeated for different temperature settings. The DSP or control logic 60 records the temperatures that correspond to the different curves. The DSP or control logic 60 obtains the inverse of each amplifier output characteristic polynomial and stores the coefficients of each inverse polynomial in registers in the DSP 60, or some memory device (not shown).

During operation, the predictor circuitry 50 predicts the temperature of the amplifier based on the energy of the input signal, as indicated by block 102. The appropriate inverse polynomial coefficients for both phase and magnitude are then selected by the DSP 60 based on the results of the prediction, multiplexed by the MUXes 71–77 and applied by the polynomial calculation circuitry 80 to the input signal to compensate for amplitude and phase, as indicated by block 103.

It should be noted that the present invention is not limited to the embodiments described herein. For example although reference has been made above to the use of the invention with a power amplifier, the invention applies equally to other types of amplifiers and to other types of circuits, indeed, any entity that exhibits nonlinear behavior in response to a high level input stimuli. Also, the block diagram of FIG. 6 shows one particular circuit configuration for calculating, selecting and applying the polynomial coefficients. The present invention is not limited to the configuration shown in FIG. 6. For example, the functions performed by the MUXes 71–77 can be performed within the DSP 60. However, using the MUXes 71–77 makes it possible to select all of the coefficients for a given curve using a single selector signal, which is the output of the predictor circuitry 70. The output of the predictor circuitry 70 may be conditioned by some hardware or software (not shown) before being input to the MUXes 71–77. Alternatively, the predictor signal output from the predictor circuitry 70 may be input to the DSP 60 and processed by software and/or hardware of the DSP 60. Also, control logic other than a DSP may be used in place of the DSP. The control logic may be any type of hardware or combination of hardware and software, or even partially or wholly made up of discrete circuit components. Those skilled in the art will understand, in view of the description provided herein, that other configurations may be used to achieve the goals of the invention. In addition, other modifications may be made to the embodiments described herein and all such modifications are within the scope of the invention.

What is claimed is:

1. A pre-distorter for compensating for non-linearities in an amplifier, the pre-distorter comprising:

predictor circuitry, the predictor circuitry predicting a temperature of the amplifier based on an input signal, the predictor circuitry generating a predictor output signal that is based on the temperature prediction;

processing circuitry, the processing circuitry selecting inverse polynomial coefficients based on the predictor output signal and applying the coefficients to the input signal to compensate for non-linearities in the amplifier, wherein the processing circuitry is programmed to select inverse polynomial coefficients for a plurality of amplifier output characteristic curves corresponding to a plurality of temperatures.

2. The pre-distorter of claim 1, wherein the processing circuitry is programmed to select and output the inverse polynomial coefficients that correspond to one of said plurality of amplifier output characteristic curves based on the predictor output signal.

3. The pre-distorter of claim 1, further comprising:

multiplexer circuitry that selects the inverse polynomial coefficients that correspond to one of said plurality of amplifier output characteristic curves, the multiplexer circuitry making the selection based on the predictor output signal.

4. The pre-distorter of claim 3, further comprising:

polynomial calculation circuitry that receives the inverse polynomial coefficients selected by the multiplexer circuitry and applies the coefficients to the input signal to compensate for the input signal amplitude and phase distortion created by the amplifier.

5. A method of pre-distorting an amplifier input signal to compensate for non-linearities of the amplifier, the method comprising:

predicting a temperature of the amplifier based on the input signal; and applying inverse polynomial coefficients to the input signal, the coefficients being associated with an output characteristic curve of the amplifier for the predicted temperature, and wherein the inverse polynomial coefficients are applied by;

using the prediction to select the coefficients, the coefficients being selected from a plurality of coefficients for a plurality of respective output characteristic curves; and injecting the selected coefficients into the input signal.

6. The method of claim 5, wherein the coefficients are selected from said plurality of coefficients by one or more multiplexer circuits, the multiplexer circuits producing outputs that are provided to polynomial calculation circuitry, the polynomial calculation circuitry injecting the selected coefficients into the input signal.

7. The method of claim 5, wherein the inverse polynomial coefficients that are applied to the input signal are obtained through a training process, the training process comprising:

(a) stimulating the amplifier with an input signal having a predetermined amplitude and phase;

(b) capturing an amplifier output signal produced by the amplifier in response to the amplifier being stimulated by the input signal, the output signal being captured when the amplifier is at a certain temperature;

(c) fitting a polynomial to data describing the output signal;

(d) repeating steps (a) through (c) for a plurality of different temperatures such that a plurality of respective polynomials are generated for a plurality of respective output signals at a plurality of respective temperatures;

(d) determining the inverse of the polynomials; and (e) obtaining sets of inverse polynomial coefficients from the inverses of the polynomials, each set of coefficients corresponding to a respective one of the inverses of the polynomials and to a respective temperature, and wherein the coefficients that are applied to the input signal correspond to the set of inverse polynomial coefficients associated with the predicted temperature.

* * * * *